United States Patent
Tong

(10) Patent No.: US 10,250,196 B2
(45) Date of Patent: Apr. 2, 2019

(54) AMPLIFIER DEVICES WITH BACK-OFF POWER OPTIMIZATION

(71) Applicant: NXP USA, Inc., Austin, TX (US)

(72) Inventor: Renbin Tong, Chengdu (CN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/789,572

(22) Filed: Oct. 20, 2017

(65) Prior Publication Data

US 2018/0131329 A1 May 10, 2018

(30) Foreign Application Priority Data

Nov. 4, 2016 (CN) .......................... 2016 1 0973839

(51) Int. Cl.
| | | |
|---|---|---|
| *H03F 1/02* | (2006.01) | |
| *H03F 3/19* | (2006.01) | |
| *H03F 3/21* | (2006.01) | |
| *H01L 23/66* | (2006.01) | |
| *H01L 25/16* | (2006.01) | |
| *H01L 23/00* | (2006.01) | |
| *H03F 1/56* | (2006.01) | |
| *H03F 3/195* | (2006.01) | |
| *H03F 3/213* | (2006.01) | |

(52) U.S. Cl.
CPC .......... *H03F 1/0288* (2013.01); *H01L 23/66* (2013.01); *H01L 24/49* (2013.01); *H01L 25/16* (2013.01); *H03F 1/565* (2013.01); *H03F 3/19* (2013.01); *H03F 3/195* (2013.01); *H03F 3/211* (2013.01); *H03F 3/213* (2013.01); *H01L 2223/6611* (2013.01); *H01L 2223/6627* (2013.01); *H01L 2223/6655* (2013.01); *H01L 2223/6672* (2013.01); *H01L 2224/48091* (2013.01); *H01L 2224/48137* (2013.01); *H01L 2224/49111* (2013.01); *H01L 2224/49175* (2013.01); *H01L 2924/00014* (2013.01); *H01L 2924/19107* (2013.01); *H03F 2200/451* (2013.01)

(58) Field of Classification Search
USPC .............................. 330/124 R, 295, 286, 84
See application file for complete search history.

(56) References Cited

U.S. PATENT DOCUMENTS

| | | | | |
|---|---|---|---|---|
| 7,427,895 B1 * | 9/2008 | Okubo | .................... | H03F 3/602 330/124 R |
| 7,893,762 B2 * | 2/2011 | Hellberg | ............... | H03F 1/0288 330/124 R |

OTHER PUBLICATIONS

Özen. M. et al. "Symmetrical doherty amplifier with high efficiency over large output power dynamic range", IEEE MTT-S International Microwave Symposium (IMS2014), Tampa, FL, pp. 1-4 (Jun. 2014).

* cited by examiner

*Primary Examiner* — Hieu P Nguyen
(74) *Attorney, Agent, or Firm* — Sherry W. Schumm

(57) ABSTRACT

The embodiments described herein include amplifier devices that are typically used in radio frequency (RF) applications. The amplifier devices described herein use a plurality of phase shifters to provide selectable back-off power. Specifically, the amplifier devices can be implemented with phase shifters having phase shift values selected to provide a desired back-off power.

17 Claims, 5 Drawing Sheets

AMPLIFIER DEVICES WITH BACK-OFF POWER OPTIMIZATION

CROSS-REFERENCE TO RELATED APPLICATION

This application claims priority to Chinese patent application number 201610973839.2, filed on Nov. 4, 2016.

TECHNICAL FIELD

Embodiments of the subject matter described herein relate generally to amplifiers, and more particularly to radio frequency (RF) power amplifiers used in a variety of applications.

BACKGROUND

In general, amplifiers are used to increase the power of signals. For example, amplifiers can be used to convert low-power radio frequency (RF) signals into larger RF signals for driving the antenna of a transmitter. In such cases, amplifiers may be implemented as part of overall power amplifier used by an RF transmission system.

One measure of amplifier performance is back-off power. In general, the back-off power of an amplifier represents the output power at the point where the highest efficiency is achieved, divided by the maximum output power (P−3 dB), with the back-off power expressed in decibels (dB).

Unfortunately, some previous power amplifier designs have been limited with respect to back-off power. For example, some previous symmetrical power amplifier designs have been limited in their ability to provide arbitrary back-off power. As another example, some previous asymmetric power amplifiers have been required to implement a low power utilization ratio in order to obtain desired high back-off power. Specifically, some previous symmetrical power amplifier designs have been limited to providing back-off power of around 6 dB. Therefore, there remains a need for amplifiers that provide high performance and controllable back-off power.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The embodiments described herein can provide semiconductor devices, and particularly amplifier devices, with improved performance. For example, the embodiments described herein include amplifier devices that are typically used in radio frequency (RF) applications. The amplifier devices described herein use a plurality of phase shifters to provide improved back-off power. Specifically, the amplifier devices can be implemented with phase shifters having phase shift values selected to provide a desired back-off power. So configured, the amplifier device may provide improved high efficiency, linearity and high power performance.

Figure 1:
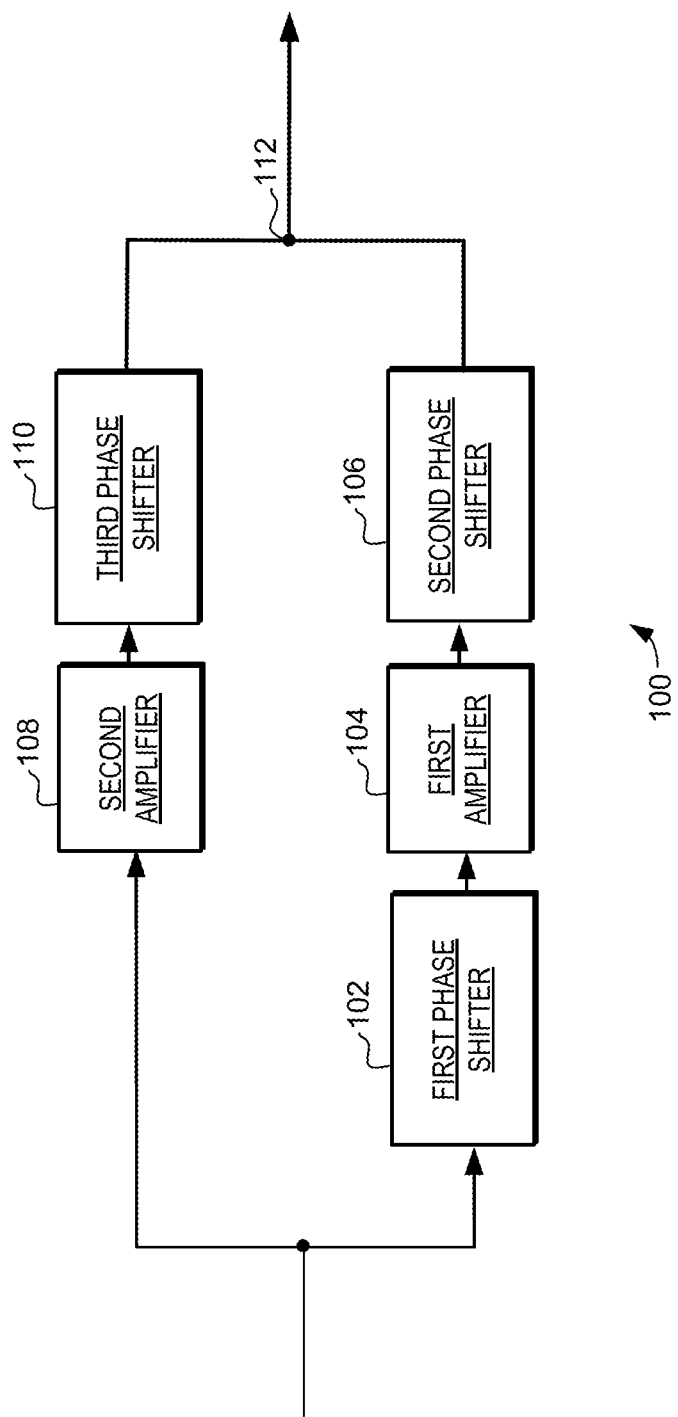
FIG. 1 is a schematic diagram of a portion of an amplifier in accordance with an example embodiment.

Turning now to FIG. 1, a schematic diagram of a portion of an exemplary amplifier device 100 is illustrated. The amplifier device 100 includes a first phase shifter 102, a first amplifier 104, a second phase shifter 106, a second amplifier 108, a third phase shifter 110, and a combining node 112. The output of the first phase shifter 102 is coupled to the input of the first amplifier 104, and the output of the first amplifier 104 is coupled to the input of the second phase shifter 106. Likewise, the output of the second amplifier 108 is coupled to the input of the third phase shifter 110. The outputs of the second phase shifter 106 and the third phase shifter 110 are coupled together at the combining node 112 to provide the amplifier device 100 output.

In accordance with the embodiments described herein, the phase shifts provided by the various phase shifters 102, 106 and 110 are selected to result in a desired back-off power. Specifically, to provide the desired back-off power, the first phase shifter 102 is configured to introduce a phase shift of $\theta_1$, the second phase shifter 106 is configured to introduce a phase shift of $\theta_2$, and the third phase shifter 110 is configured to introduce a phase shift of $\theta_3$. It should be noted that such phase shifts will commonly be frequency dependent, and in one embodiment the various phase shifters 102, 106 and 110 are configured to provide each of the selected phase shifts at a center operational frequency of an expected RF input signal.

Furthermore, in one embodiment the various phase shifters 102, 106 and 110 are selected to each provide a non-quadrature phase shift. In such an embodiment, the phase shifts $\theta_1$, $\theta_2$, and $\theta_3$ would each be a non-quadrature phase shift, where the term "non-quadrature phase shift" refers to a phase shift that is not a multiple of +/−90 degrees. Thus, a non-quadrature phase shift is a non-zero phase shift that is not +/−90, +/−180, +/−270, +/−360, and so on.

Furthermore, in one specific embodiment that will be described in greater detail below, the first phase shifter 102, the second phase shifter 106, and the third phase shifter 110 are implemented such that $\theta_1 = \theta_3 - \theta_2$. When so provided, the phase shifters 102, 106 and 110 can provide a desired back-off power. In addition, the above equation also could be rearranged as $\theta_1 + \theta_2 = \theta_3$, indicating that the phase shifts are selected so that equal total phase delays are applied through the first amplification path (including amplifier 104) and through the second amplification path (including amplifier 108). This ensures that the signals amplified through the first and second amplification paths are re-combined in-phase at the combining node 112.

As more specific examples, $\theta_1$ can have a phase shift value of between about 5 and about 89 degrees, $\theta_2$ can have a phase shift value of between about 5 and about 85 degrees, and $\theta_3$ has a phase shift value between about 91 and about 105 degrees. As even more specific examples, $\theta_1$ can have a phase shift value of between about 40 and about 89 degrees, $\theta_2$ can have a phase shift value of between about 5 and about 70 degrees, and $\theta_3$ has a phase shift value between about 91 and about 105 degrees. In other example embodiments, $\theta_1$, $\theta_2$, and $\theta_3$ may have values outside of the above-given ranges.

A variety of devices and structures can be used to implement the phase shifters 102, 106 and 110. As non-limiting examples, the phase shifters 102, 106 and 110 can be implemented with transmission lines having electrical lengths configured to provide the desired phase shift. Such transmission lines can be implemented as patterned conductors, microstrip lines, and/or as conductive features within integrated passive devices (IPDs). Again, in such an implementation the phase shifters 102, 106 and 110 would typically each be implemented to provide its desired phase shift at a specific frequency, e.g., at the expected or likely center operational frequency of $f_0$ of the amplifier device 100.

In a typical embodiment, components making up the amplifier device 100 would be mounted in a semiconductor device package, where the package provides the structure enclosing the amplifier device 100 and two or more leads for accessing the amplifier device 100 input, output, and other nodes (e.g., bias nodes). Thus, as used herein, the term "package" means a collection of structural components (e.g., including a flange or substrate) to which the primary electrical components (e.g., semiconductor dies, discrete devices, input and output leads and various electrical interconnections) are coupled, where such a "package" is a distinct device that may be coupled to a printed circuit board (PCB) or other substrate that includes other portions of the amplifier.

In one particular implementation, the amplifier device 100 is implemented as a Doherty amplifier. In such an embodiment, the first amplifier 104 can be implemented as a peaking amplifier, and the second amplifier 108 can be implemented as a carrier amplifier. A detailed example of such a Doherty amplifier will be discussed below with reference to FIG. 3.

Furthermore, the amplifier device 100 can be implemented as either a symmetric amplifier or an asymmetric amplifier. In general, a symmetric amplifier is one where the first amplifier 104 and the second amplifier 108 have equal power capability. Stated another way, the amplifier power ratio defined as $r=P_{first\ amplifier}/P_{second\ amplifier}$ is equal to one (r=1) in a symmetric amplifier. Conversely, in a typical asymmetric amplifier the first amplifier 104 has greater power capability compared to the second amplifier 108 such that r>1.

As was noted above, the amplifier device 100 can be implemented with phase shifters 102, 106 and 110 selected to provide a desired back-off power. As one specific example, where $\gamma$ is the desired back-off power, $V_{bk}$ is the normalized open or turn on voltage of the first amplifier 104, and r is amplifier power ratio, $$r \leq \left(\frac{1}{\gamma} - 1\right),$$

then the relationship between the desired back-off power $\gamma$ and the open voltage $V_{bk}$ can be expressed as $V_{bk}=(r+1)\gamma^2$ where $V_{bk}$ is restricted as $$V_{bk} \leq \frac{1}{r+1}.$$

From this, the relationship of the phase shift $\theta_1$ of the first phase shifter 102 can be expressed as:

$$\cos(2\theta_1) = \frac{\frac{(1-V_{bk})^2}{2} - rV_{bk}}{1 - V_{bk} - \frac{(1-V_{bk})^2}{2}}$$

and the phase shift $\theta_3$ of the third phase shifter 110 can be expressed as:

$$\theta_3 = \frac{1}{2}\left(\pi + \arcsin\left(\frac{1}{r+1}\sin(2\theta_1)\right)\right)$$

and the phase shift $\theta_2$ of the second phase shifter 106 can be expressed as:

$$\theta_2 = \theta_3 - \theta_1$$

Figure 2A:
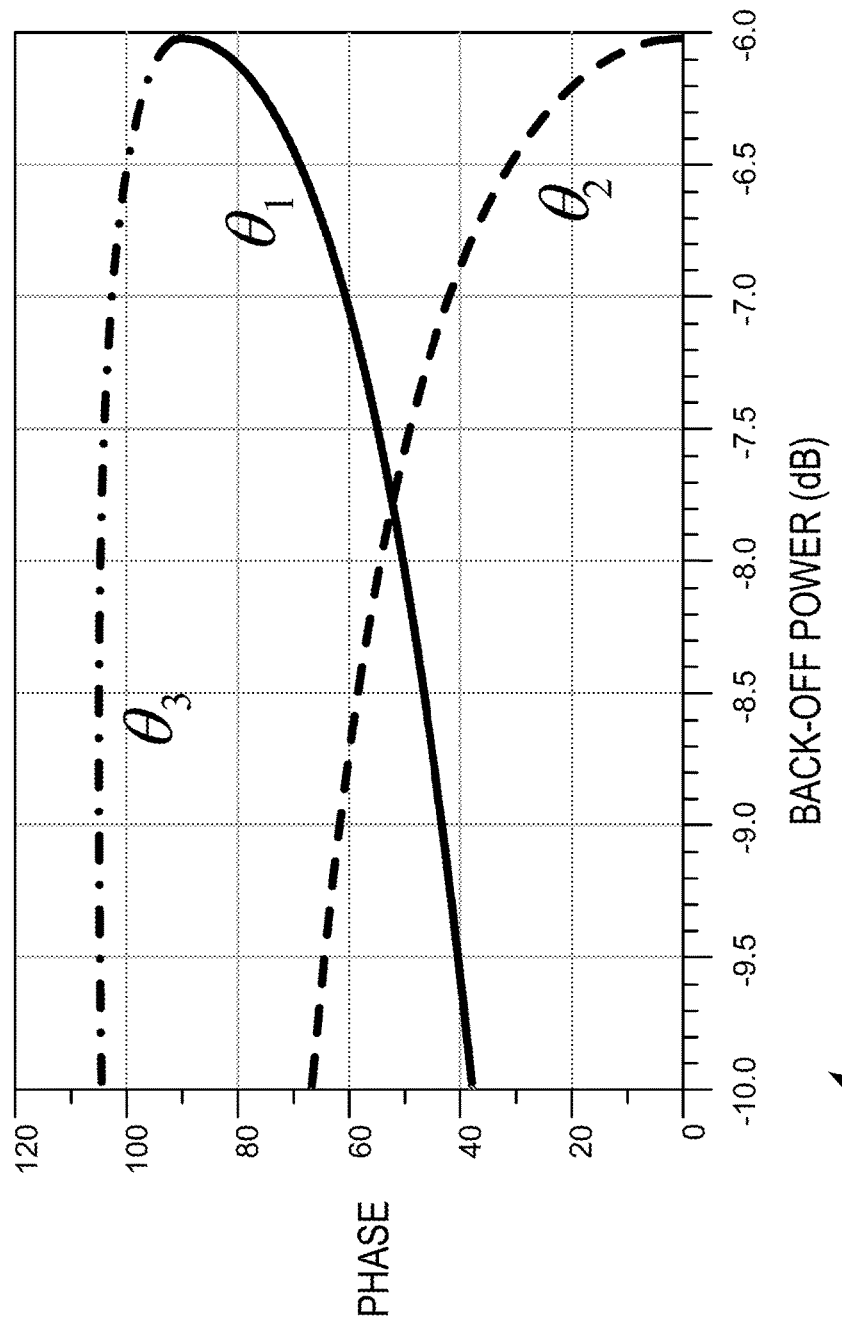
FIG. 2A is a graphical representation of exemplary phase shift values and back-off powers for a symmetric amplifier device in accordance with an example embodiment.

Taken together, these equations can be used to determine the phase shifts $\theta_1$, $\theta_2$, and $\theta_3$ needed to provide a desired back-off power $\gamma$. Turning now to FIG. 2A, a graph 250 illustrates exemplary relationships between the phase shifts (in degrees) provided by phase shifters 102, 106 and 110 and the desired back-off power (in dB) in a symmetric amplifier (e.g., a symmetric Doherty amplifier). Specifically, the curves in FIG. 2A show the values for $\theta_1$, $\theta_2$, and $\theta_3$ which, when implemented in an amplifier, provide a desired back-off power. As can be seen in this example, by selecting appropriate values for $\theta_1$, $\theta_2$, and $\theta_3$ back-off powers of between −10.0 dB and −6.0 dB can be provided. For example, for a desired back-off power of −7.0 dB, $\theta_1$ could have a phase shift of about 60 degrees, $\theta_2$ could have a phase shift of about 40 degrees, and $\theta_3$ could have a phase shift of about 102 degrees. Thus, the embodiments described herein provide the ability to tailor the amplifier device 100 to have a desired back-off power by selecting and implementing appropriate phase shift values $\theta_1$, $\theta_2$, and $\theta_3$. The curves shown in FIG. 2A could deviate slightly from the paths shown.

Figure 2B:
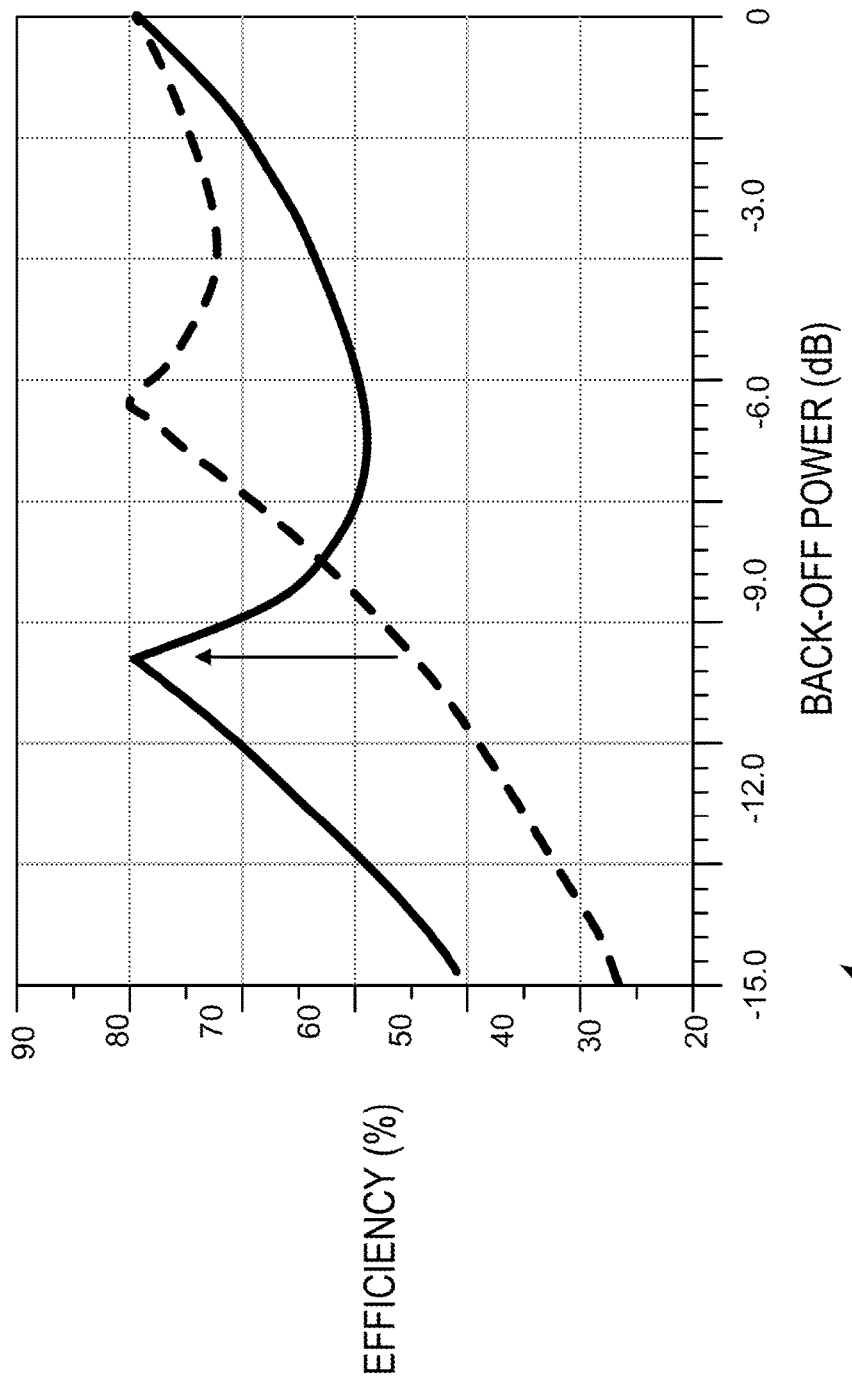
FIG. 2B is a graphical representation of efficiency percentage versus back-off powers in accordance with an example embodiment.

Turning now to FIG. 2B, a graph 275 illustrates symmetrical amplifier efficiency (in percent) versus back-off power (in dB) for an exemplary embodiment compared to a traditional symmetrical Doherty amplifier. Specifically, the amplifier efficiency of an exemplary embodiment is illustrated in the solid line, while a traditional symmetrical Doherty amplifier efficiency is illustrated with the dashed line. As can be seen in graph 275, the efficiency curve of the amplifier is "pulled up" (indicated with the vertical arrow) at about −10 dB, which is the value that corresponds to a desired back-off power. Thus, such an amplifier can provide a relatively high efficiency at such a desired back-off power.

As one specific example for symmetric amplifier device 100 where r=1, by providing a phase shift $\theta_1$=50.7113 degrees, a phase shift $\theta_2$=53.9657 degrees, and a phase shift $\theta_3$=104.677 degrees, a back-off power of −8 dB can be achieved. As another example of a symmetric amplifier device 100, by providing a phase shift $\theta_1$=37.762 degrees, a phase shift $\theta_2$=66.716 degrees, and a phase shift $\theta_3$=104.478 degrees, a back-off power of −10 dB can be achieved.

As another example for an asymmetric amplifier device 100 with r=1.5 and $V_{bk}$=0.25, by providing a phase shift $\theta_1$=50.769 degrees, a phase shift $\theta_2$=50.768 degrees, and a phase shift $\theta_3$=101.536 degrees, a back-off power of −10 dB can be achieved. As another example for an asymmetric amplifier device 100 with r=2 and $V_{bk}$=0.3, by providing a phase shift $\theta_1$=70.6 degrees, a phase shift $\theta_2$=25.4 degrees, and a phase shift $\theta_3$=96 degrees, a −10 dB back-off power can be achieved.

Figure 3:
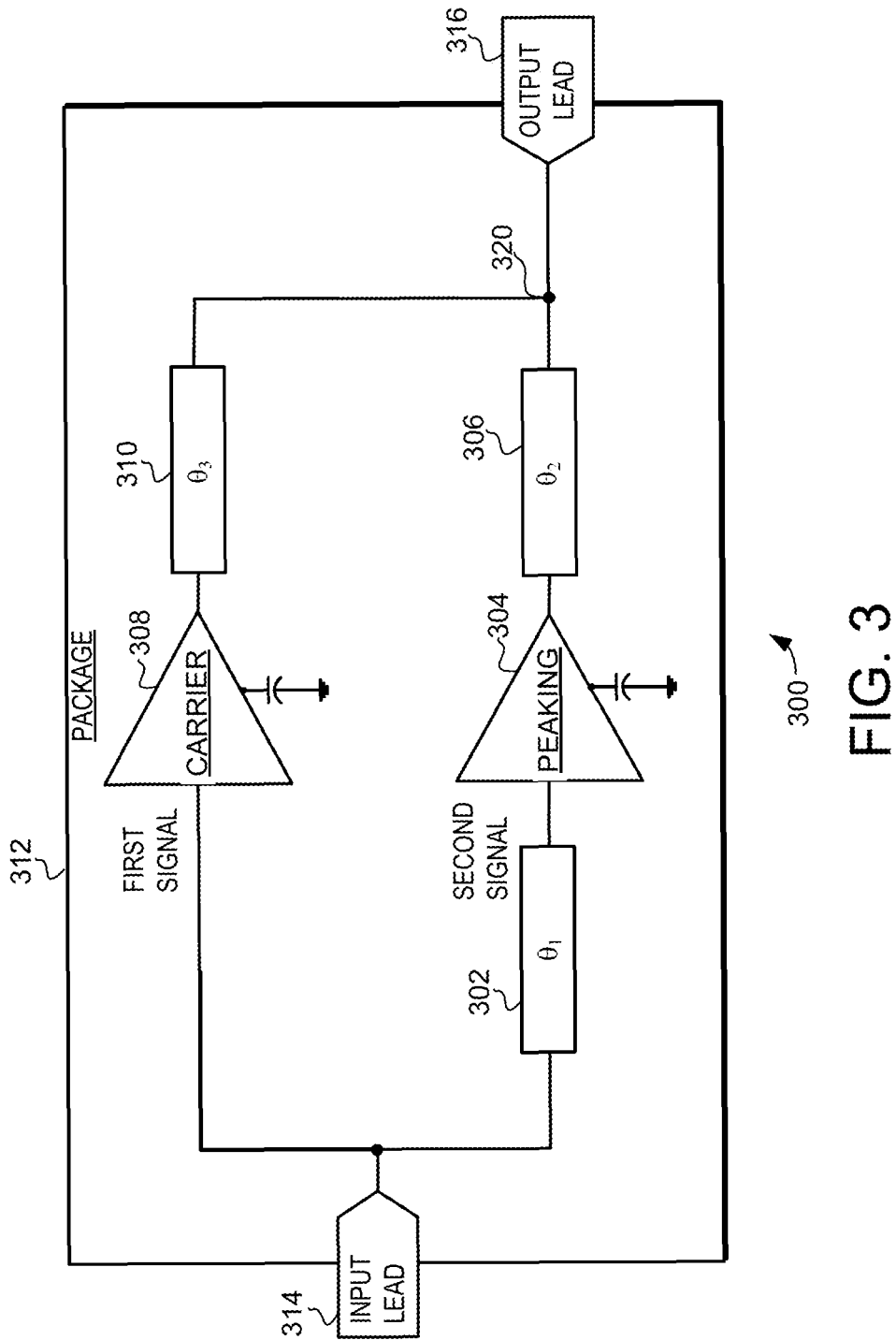
FIG. 3 is a circuit diagram of a portion of an exemplary Doherty amplifier in accordance with an example embodiment.

As was noted above, in some embodiments the amplifier device 100 can be implemented as a modified Doherty amplifier. Turning now to FIG. 3, a schematic diagram of a portion of an exemplary Doherty amplifier device 300 is illustrated. The Doherty amplifier device 300 includes a first non-quadrature phase shifter 302, a peaking amplifier 304, a second non-quadrature phase shifter 306, a carrier amplifier 308, and a third non-quadrature phase shifter 310. Some or all portions of the Doherty amplifier device 300 can be mounted within a semiconductor device package 312. When both the input splitter and the output combiner are implemented within the package, the package includes at least an input lead 314 and an output lead 316. The input lead 314 is configured to receive an RF input signal, and that RF input signal is divided, with a first portion of the RF signal being applied to the input of the first non-quadrature phase shifter 302, and a second portion of the RF signal being applied to an input of the carrier amplifier 308. The output of the first phase shifter 302 is coupled to the input of the peaking amplifier 304, and the output of the peaking amplifier 304 is coupled to the input of the second phase shifter 306. Likewise, the output of the carrier amplifier 108 is coupled to the input of the third non-quadrature phase shifter 310. The outputs of the second non-quadrature phase shifter 306 and the third non-quadrature phase shifter 310 are combined together to provide an amplified RF signal to the output lead 316.

In accordance with the embodiments described herein, the phase shifts provided by the various phase shifters 302, 306 and 310 are selected to result in a desired back-off power. Specifically, to provide the desired back-off power, the first phase shifter 302 is again configured to introduce a non-quadrature phase shift of $\theta_1$, the second phase shifter 306 is again configured to introduce a non-quadrature phase shift of $\theta_2$, and the third phase shifter 310 is configured to introduce a non-quadrature phase shift of $\theta_3$. The values of these phase shifts $\theta_1$, $\theta_2$, and $\theta_3$ can be determined according to the equations described above. When so implanted, the modified Doherty amplifier device 300 can provide a selected back-off power.

In a typical implementation, the Doherty amplifier device 300 can be implemented as a symmetrical amplifier, where the peaking amplifier 304 and the carrier amplifier 308 are implemented with the same size and number of devices. Furthermore, the both the peaking amplifier 304 and the carrier amplifier 308 could be implemented as single-stage or multiple-stage amplifiers. In a multiple-stage implementation, both the peaking amplifier 304 and the carrier amplifier 308 could include multiple transistors coupled together in series. For example, the peaking amplifier 304 can comprise one or more transistors (e.g., including a driver transistor and a final stage transistor), and the carrier amplifier 308 can comprise one or more other transistors (e.g., including a driver transistor and a final stage transistor).

In a typical embodiment, the peaking amplifier 304 and carrier amplifier 308 would be implemented with suitable RF-capable transistors with relatively high power capability. For example, the peaking amplifier 304 and carrier amplifier 308 can be implemented with Gallium Nitride (GaN) high electron mobility transistors (HEMTs), laterally diffused metal oxide semiconductor (LDMOS) transistors, or other types of transistors.

Additionally, some embodiments can include multiple peaking amplifiers 304 coupled in parallel with the carrier amplifier 308 to increase power capacity.

In some embodiments the peaking amplifier 304 and the carrier amplifier 308 are biased differently. For example, the peaking amplifier 304 can be biased at class C (or deep class C) while the carrier amplifier 308 is biased at class AB. Such a biasing can facilitate higher efficiency, gain, and/or higher linearity in the Doherty amplifier device 300.

The phase shifters 302, 306 and 310 can again be implemented in a variety of ways. As non-limiting examples, the phase shifters 302, 306 and 310 can be implemented with transmission lines having electrical lengths configured to provide the desired phase shift. Such transmission lines can be implemented as patterned conductors, microstrip lines, and/or conductive features within IPDs.

As a first example, the phase shifters 302, 306 and 310 can be implemented as one or more conductors in an IPD. In general, IPDs are formed using wafer-level or die-level fabrication techniques such as photolithography. Thus, in such an example, the phase shifters 302, 306 and 310 can be formed on a wafer by depositing and patterning a conductive material to have the selected length and other desirable features. The wafer is then singulated to define a separate die that includes one or more of the phase shifters 302, 306 and 310, and that die is packaged (e.g., coupled to the package flange or substrate) with other elements of the Doherty amplifier device 300.

As a second example, the phase shifters 302, 306 and 310 can be implemented as conductors defined on a PCB substrate. In such an example, the phase shifters 302, 306 and 310 can be printed on the PCB substrate and/or within the PCB substrate layers to have the selected length, and then placed in the package (e.g., coupled to the package flange or substrate) with other elements of the amplifier device 300.

As a more particular example, the phase shifters 302, 306 and 310 can be implemented with microstrip lines. In general, a microstrip line is a type of transmission line that includes a conductive strip that is separated from a ground plane by a dielectric layer. Microstrip lines can be formed on a variety of substrates, including PCB substrates and semiconductor wafer/die substrates, and with a variety of manufacturing techniques. In any of these embodiments, the microstrip line is formed with a length selected to provide the desired phase shift. In such an example, the transmission line can be formed as a microstrip line of the selected length, and then placed in the package with other elements of the amplifier device 300.

As one detailed example for a symmetric Doherty power amplifier, the phase shifters 306 and 310 can be implemented with microstrip lines, and their characteristic impedances can be normalized to $R_{OPT}$ (e.g., $V_{DD}$/Imax), at the combining node 320, and the output impedance can be derived to $R_{OPT}/2$. And more generally, if such an arrangement is also used as an external output match (e.g., outside of package 312), it can be realized as a power combiner. For example, under such an embodiment $R_{OPT}$ can commonly be 50Ω in RF circuit.

As one detailed example for an asymmetric Doherty power amplifier, the phase shifters 306 and 310 can again be implemented with microstrip lines. But in these embodiments the output of the carrier amplifier 308 should match to the value of $R_{OPT}$, and then the output of the peaking amplifier 304 should match to $R_{OPT}/r$, and the impedance at the combining node 320 and output lead 316 should match to $R_{OPT}/(1+r)$, where r is again the amplifier power ratio.

Figure 4:
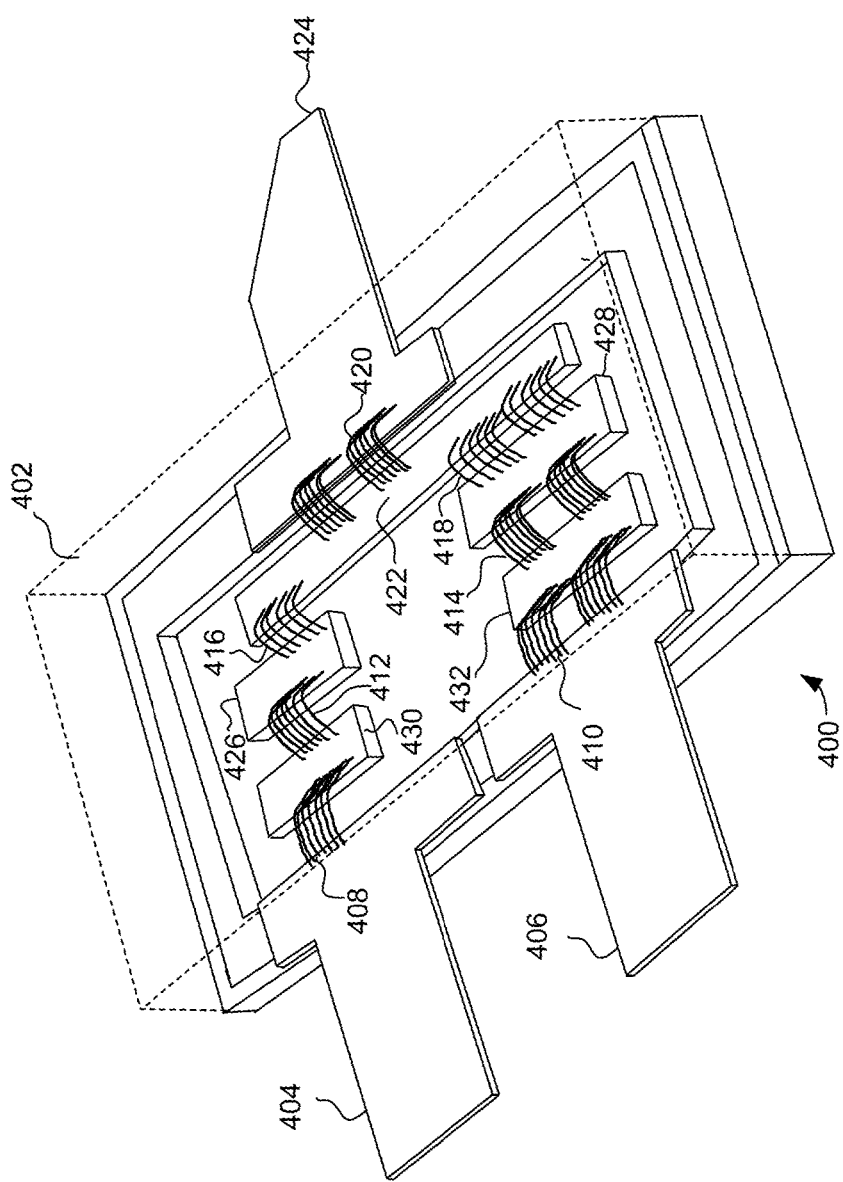
FIG. 4 is a perspective, cut-away view of an exemplary packaged device that includes a portion of an amplifier in accordance with an example embodiment.

Turning now to FIG. 4, a perspective, cut-away view of an exemplary device 400 that includes a portion of an amplifier device is illustrated. The device 400 includes a package 402, input leads 404 and 406, bond wire arrays 408, 410, 412, 414, 416, 418 and 420, and an output lead 424. Also included are a carrier transistor die 426, a peaking transistor die 428, a first IPD 432 (which can include the first phase shifter and a shunt capacitor), a second IPD 422 (which can include the second and third phase shifters and a combiner node), and a third IPD 430 (which can include a shunt capacitor).

In accordance with the embodiments described herein, the first IPD 432, the second IPD 422 are each fabricated to include one or more phase shifters, with the phase shift provided by those phase shifters selected to result in a desired back-off power for the device 400. Specifically, to provide the desired back-off power, the first IPD 432 is configured with a first phase shifter (e.g., first phase shifter 102) to introduce a phase shift of $\theta_1$. Similarly, the second IPD 422 is configured with a second phase shifter (e.g., second phase shifter 106) to introduce a phase shift of $\theta_2$ and third phase shifter (e.g., third phase shifter 110) to introduce a phase shift of $\theta_3$. The second IPD 422 can also include a combiner (e.g., combiner node 112) to combine the outputs of the second and third phase shifters. Finally, it should again be noted that device 400 is a simplified representation of a portion of an amplifier, and in a more typical implementation the amplifier would include additional features not illustrated in FIG. 4.

The package 402 includes a package substrate (e.g., formed of PCB materials with various conductive features) or flange (e.g., a rigid conductive component) to which the various dies are coupled. The package substrate or flange may provide an electrical ground reference for the device (e.g., for the sources of the transistors in the carrier transistor die 426 and peaking transistor die 428). The package 402 also may include an isolator that electrically isolates the package substrate or flange from the leads 404, 406, 424, or alternatively may include encapsulation that provides such electrical isolation. The package 402 may be an air-cavity package or an overmolded (encapsulated) package, in various embodiments.

The embodiments described herein can provide semiconductor devices, and particularly amplifier devices, with improved performance. For example, the embodiments described herein include amplifier devices that are typically used in radio frequency (RF) applications. The amplifier devices described herein use a plurality of phase shifters to provide improved back-off power. Specifically, the amplifier devices can be implemented with phase shifters having phase shift values selected to provide a desired back-off power. So configured, the amplifier device can provide improved device efficiency, linearity and high power performance.

In a first embodiment, an amplifier device is provided that comprises: first phase shifter, the first phase shifter having an input and an output, the first phase shifter configured to introduce a phase shift of $\theta_1$, a first amplifier, the first amplifier having an input and an output, the first amplifier input coupled to the first phase shifter output; a second phase shifter, the second phase shifter having an input and an output, the second phase shifter input coupled to the first amplifier output, the second phase shifter configured to introduce a phase shift of $\theta_2$; a second amplifier, the second amplifier having an input and an output; and a third phase shifter, the third phase shifter having an input and an output, the third phase shifter input coupled to the second amplifier output, the third phase shifter configured to introduce a phase shift of $\theta_3$.

In a second embodiment, an Doherty amplifier device is provided that comprises: a device package including an output lead and an input lead, the input lead configured to receive an RF input signal having a center operational frequency of $f_0$, the device package encasing: a first phase shifter, the first phase shifter having an input and an output, the first phase shifter input coupled to input lead, the at least phase shifter configured to introduce a non-quadrature phase shift of $\theta_1$ to signals having a frequency of $f_0$; a peaking amplifier, the peaking amplifier having an input and an output, the peaking amplifier input coupled to the first phase shifter output; a second phase shifter, the second phase shifter having an input and an output, the second phase shifter input coupled to the peaking amplifier output, the second phase shifter configured to introduce a non-quadrature phase shift of $\theta_2$ to signals having a frequency of $f_0$, the second phase shifter output coupled to the output lead; a carrier amplifier, the carrier amplifier having an input and an output, the carrier amplifier input coupled to the input lead; and a third phase shifter, the third phase shifter having an input and an output, the third phase shifter input coupled to the carrier amplifier output, the third phase shifter configured to introduce a non-quadrature phase shift of $\theta_3$ to signals having a frequency of $f_0$, the third phase shifter output coupled to the output lead.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Furthermore the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict several exemplary arrangements of elements, additional intervening elements, devices, features, or components may be present in other embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier device, comprising:
   a package substrate;
   a first input lead coupled to the package substrate;
   a second input lead coupled to the package substrate;
   an output lead coupled to the package substrate;
   a first phase shifter, the first phase shifter having an input and an output, the input of the first phase shifter coupled to the first input lead, and the first phase shifter configured to introduce a phase shift of $\theta_1$;
   a first amplifier die coupled to the package substrate, the first amplifier die having an input and an output, the first amplifier die input coupled to the first phase shifter output;
   a second amplifier die coupled to the package substrate, the second amplifier die having an input and an output, the second amplifier die input coupled to the second input lead; and
   a first integrated passive device (IPD) coupled to the package substrate between the first and second amplifier dies and the output lead, wherein the first IPD includes
      a second phase shifter, the second phase shifter having an input and an output, the second phase shifter input coupled to the first amplifier output, the second phase shifter configured to introduce a phase shift of $\theta_2$,
      a third phase shifter, the third phase shifter having an input and an output, the third phase shifter input coupled to the second amplifier output, the third phase shifter configured to introduce a phase shift of $\theta_3$, and
      a combiner node at which the second phase shifter output and the third phase shifter output are coupled together.

2. The amplifier device of claim 1, wherein the first phase shifter is implemented such that $\theta_1$ this a non-quadrature phase shift, wherein the second phase shifter is implemented such that $\theta_2$ is a non-quadrature phase shift, and wherein the third phase shifter is implemented such that $\theta_3$ is a non-quadrature phase shift.

3. The amplifier device of claim 1, wherein the first phase shifter, the second phase shifter, and the third phase shifter are implemented such that $\theta_1=\theta_3-\theta_2$.

4. The amplifier device of claim 1, wherein $\theta_1$ has a value of between 5 and 89 degrees, wherein $\theta_2$ has a value of between 5 and 85 degrees, and wherein $\theta_3$ has a value between 91 and 105 degrees.

5. The amplifier device of claim 1, wherein $\theta_1$ has a value of between 40 and 89 degrees, wherein $\theta_2$ has a value of between 5 and 70 degrees, and wherein $\theta_3$ has a value between 91 and 105 degrees.

6. The amplifier device of claim 1, wherein the first amplifier die comprises a peaking amplifier in a Doherty amplifier, and wherein the second amplifier die comprises a carrier amplifier in the Doherty amplifier.

7. The amplifier device of claim 1, wherein the amplifier device is a symmetric amplifier device.

8. The amplifier device of claim 1, wherein the first phase shifter comprises a first transmission line having an electrical length configured to provide the phase shift of $\theta_1$.

9. The amplifier device of claim 8, wherein the first transmission line comprises a microstrip line.

10. The amplifier device of claim 8, wherein the first transmission line comprises a conductor defined on a printed circuit board (PCB).

11. The amplifier device of claim 8, wherein the first transmission line comprises a conductive feature of a second IPD.

12. The amplifier device of claim 1, wherein the first phase shifter input is coupled to an amplifier input, the amplifier input configured to receive an RF input signal having a center operational frequency.

13. The amplifier device of claim 1, wherein:
   the first amplifier die is a peaking transistor die of a Doherty power amplifier; and
   the second amplifier die is a carrier transistor die of the Doherty power amplifier.

14. The amplifier device of claim 1, further comprising:
   a first bond wire array coupling the output of the first amplifier die to the input of the second phase shifter at a first end of the first IPD;
   a second bond wire array coupling the output of the second amplifier die to the input of the third phase shifter at a second end of the first IPD; and
   a third bond wire array coupling the combiner node to the output lead.

15. The amplifier device of claim 14, further comprising:
   a fourth bond wire array coupling the first input lead to the input of the first phase shifter; and
   a fifth bond wire array coupling the output of the first phase shifter to the input of the first amplifier die.

16. The amplifier device of claim 15, further comprising:
   a second IPD coupled to the package substrate between the first input lead and the first amplifier die, wherein the first IPD includes the first phase shifter.

17. The amplifier device of claim 16, wherein the second IPD further comprises:
   a shunt capacitor.

* * * * *